(12) United States Patent
Yoneyama et al.

(10) Patent No.: US 9,627,293 B2
(45) Date of Patent: Apr. 18, 2017

(54) SEMICONDUCTOR DEVICE AND HEAT-CONDUCTIVE SHEET

(71) Applicant: Mitsubishi Electric Corporation, Tokyo (JP)

(72) Inventors: Rei Yoneyama, Tokyo (JP); Kozo Harada, Tokyo (JP); Isao Oshima, Tokyo (JP); Yoshitaka Otsubo, Tokyo (JP); Rena Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/696,199

(22) Filed: Apr. 24, 2015

(65) Prior Publication Data

US 2015/0357262 A1     Dec. 10, 2015

(30) Foreign Application Priority Data

Jun. 4, 2014   (JP) .................................. 2014-115871

(51) Int. Cl.
*H01L 23/427* (2006.01)
*H01L 21/48* (2006.01)
(Continued)

(52) U.S. Cl.
CPC ...... *H01L 23/4275* (2013.01); *H01L 21/4871* (2013.01); *H01L 23/3675* (2013.01);
(Continued)

(58) Field of Classification Search
CPC ..... H01L 33/64; H01L 33/641; H01L 33/642; H01L 33/645; H01L 23/38; H01L 23/40;
(Continued)

(56) References Cited

U.S. PATENT DOCUMENTS 5,315,154 A * 5/1994 Elwell ................ H01L 23/3737
257/707
5,457,165 A * 10/1995 Hermansen .......... C08G 59/226
525/113
(Continued)

FOREIGN PATENT DOCUMENTS

EP         1641040 A2     3/2006
JP       H11-168161 A     6/1999
(Continued)

*Primary Examiner* — Jose R Diaz
(74) *Attorney, Agent, or Firm* — Studebaker & Brackett PC (57) ABSTRACT

In a conventional semiconductor device, a pattern serving as a heat dissipating material is formed by applying a phase transition material. Provided is a semiconductor device that can reduce collapse of a pattern shape even if a shock is applied to the pattern formed with the phase transition material that is liquefied when the environmental temperature is not sufficiently controlled. The semiconductor device includes semiconductor elements mounted inside a semiconductor module (10); a heat radiating surface (13), formed in the semiconductor module (10), dissipating heat generated in the semiconductor elements to a heat radiator; a pattern (14) formed on the heat radiating surface and made from a phase transition material; and a film (15) serving as a first film that covers the pattern (14).

11 Claims, 5 Drawing Sheets

(51) Int. Cl.
*H01L 23/367* (2006.01)
*H01L 23/544* (2006.01)

(52) U.S. Cl.
CPC .. *H01L 23/544* (2013.01); *H01L 2223/54426* (2013.01); *H01L 2924/0002* (2013.01); *Y10T 428/24802* (2015.01)

(58) Field of Classification Search
CPC . H01L 23/427; H01L 23/4275; H01L 23/367; H01L 23/3672; H01L 23/3675; H01L 23/3677; H01L 21/4871
See application file for complete search history.

(56) References Cited

U.S. PATENT DOCUMENTS

| | | | |
|---|---|---|---|
| 8,137,806 | B2 | 3/2012 | Okabayashi |
| 8,273,209 | B2 | 9/2012 | Hattori et al. |
| 8,937,384 | B2 * | 1/2015 | Bao ................ H01L 23/427 257/707 |
| 2006/0063017 | A1 | 3/2006 | Funahashi |
| 2008/0233368 | A1 * | 9/2008 | Hartmann ........... D06M 23/12 428/206 |
| 2009/0135095 | A1 * | 5/2009 | Kawada .......... H05K 7/20963 345/60 |

FOREIGN PATENT DOCUMENTS

| | | |
|---|---|---|
| JP | 3072491 U | 10/2000 |
| JP | 2006-121051 A | 5/2006 |
| JP | 2008-192697 A | 8/2008 |
| JP | 2009-277976 A | 11/2009 |
| JP | 2010-129632 A | 6/2010 |
| JP | 2010-149509 A | 7/2010 |
| WO | 97/48957 A1 | 12/1997 |

* cited by examiner

SEMICONDUCTOR DEVICE AND HEAT-CONDUCTIVE SHEET

TECHNICAL FIELD

The present invention relates to a semiconductor device.

BACKGROUND ART

In a conventional semiconductor device, in order to dissipate heat generated in mounted semiconductor elements by making contact with a cooling element that is operated as a heat radiator, a pattern having a shape for enhancing adhesiveness to the cooling element is formed by applying a heat dissipating material (for example, refer to Japanese Unexamined Patent Publication No. 2009-277976). In addition, the device is shipped with the coated surface being exposed.

In the semiconductor device described above, there is a risk that the semiconductor device reaches a high temperature under a situation in which the environmental temperature is not sufficiently controlled at the time of shipment to a customer or during transportation to a customer, etc. In such a case, there has been a problem in that, if the coated heat dissipating material is a phase transition material, the heat dissipating material is liquefied, and if a shock is applied to the pattern of the heat dissipating material, the shape of the pattern is collapsed.

SUMMARY OF THE INVENTION

The present invention has been made to solve the problem described above, and an object thereof is to provide a semiconductor device that can reduce collapse of the shape of the pattern formed with the phase transition material even if a shock is applied to the pattern that is liquefied when the environmental temperature is not sufficiently controlled.

The semiconductor device according to the present invention includes semiconductor elements mounted inside a semiconductor module, a heat radiating surface, formed in the semiconductor module, dissipating heat generated in the semiconductor elements to a heat radiator, a pattern made from a phase transition material and formed on the heat radiating surface, and a first film covering the pattern.

The semiconductor device according to the present invention can reduce collapse of the shape of a pattern made from a phase transition material owing to a tension in the interface between the pattern and the film, even if a shock is applied to the pattern that is liquefied owing to a high temperature of the semiconductor device when the environmental temperature is not sufficiently controlled at the time of shipment to a customer or during transportation to a customer, etc.

MODES FOR CARRYING OUT THE INVENTION

Figure 1:
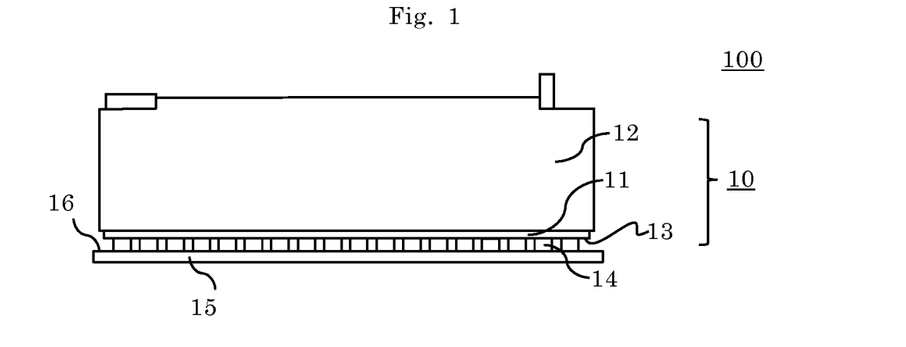
FIG. 1 is a side view showing a semiconductor device 100 according to Embodiment 1 of the invention.

First, a configuration of a semiconductor device 100 according to Embodiment 1 of the invention will be described. FIG. 1 is a side view showing a semiconductor device 100 according to Embodiment 1 of the invention. The semiconductor device 100 shown in FIG. 1 includes a semiconductor module 10, a pattern 14, and a film 15 serving as a first film having a bonding surface 16. The semiconductor module 10 includes a metal plate 11 having a heat radiating surface 13, and a case 12.

The semiconductor module 10 in FIG. 1 will be described first. Inside the case 12 of the semiconductor module 10, semiconductor elements such as a diode, an IGBT (Insulated Gate Bipolar Transistor), or a MOSFET (Metal Oxide Semiconductor Field Effect Transistor) are mounted. Heat generated in the mounted semiconductor elements is dissipated through the heat radiating surface 13 of the metal plate 11 by attaching the semiconductor module 10 to a heat radiator. The heat radiator represents a device that is attached to a heat generating device and whose purpose is to decrease a temperature of a device attached thereto by heat dissipation. The way the heat is dissipated may be natural cooling, forced air cooling or water cooling. In addition, a cooling element such as a Peltier element may be used.

The metal plate 11 has the heat radiating surface 13 through which the heat generated in the semiconductor elements mounted inside the semiconductor module 10 is dissipated to the heat radiator. The metal plate 11 is made of metal, and preferably copper is used.

The case 12 houses the semiconductor elements, etc., mounted inside the semiconductor module 10, and protects them. The case 12 is produced from any suitable material, and is made from a thermoplastic resin such as a polyphenylene sulfide resin and a polybutylene terephthalate resin. Thermoplastic resins such as a polyamide resin, a polyethylene resin, and a polyester resin can also be used.

Next, the pattern 14 in FIG. 1 will be described. The pattern 14 is made from a phase transition material 141, and formed on the heat radiating surface 13. The phase transition material 141 is a material that includes a first component that is volatile and liquid at a room temperature for adjusting viscosity of the material, a second component that is solid at a room temperature and liquid at a slightly elevated temperature, and particles that are tiny and heat-conductive (for example, aluminum or aluminum oxide, etc.) as a filler. Here, the room temperature is preferably in the range from 20 to 27 degrees centigrade and the slightly elevated temperature is preferably in the range from 35 to 60 degrees centigrade. Further, the phase transition material 141 exhibits thixotropy when liquefied. The pattern 14 is formed in such a way that the phase transition material 141 is applied on the heat radiating surface 13 and the first component is volatilized. Here, the pattern 14 is configured with a plurality of coated regions shown in FIG. 1. Note that, the pattern 14 may be configured with one coated region such as the entire surface of the heat radiating surface 13.

Next, the film 15 shown in FIG. 1 will be described. The film 15 has the bonding surface 16 that is bonded to the heat radiating surface 13 of the semiconductor module 10 through the pattern 14. The bonding surface 16 is made rough through a process of embossing or, convex or linear pattern processing. The size and the thickness of the embossing pattern or, convex or linear pattern should be at least smaller than the shape of the pattern 14. In the case of the linear pattern, the direction may be perpendicular, parallel, or oblique to one of the sides of the film 15. In addition, the line may be a straight line, a dotted line, or an undulating line.

Figure 2:
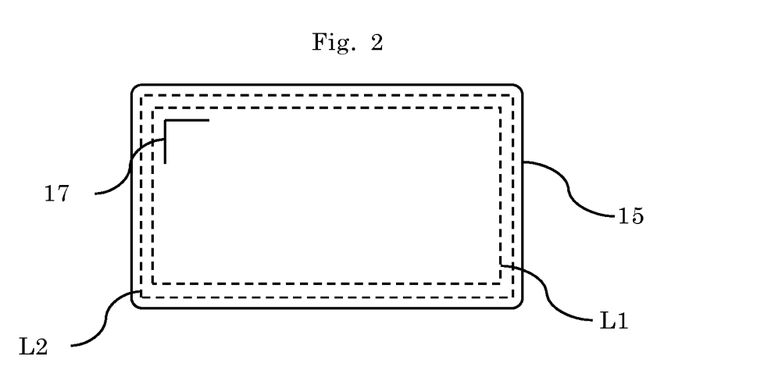
FIG. 2 is a bottom view showing the semiconductor device 100 according to Embodiment 1 of the invention.

FIG. 2 is a bottom view viewed from the underneath of the semiconductor device 100 in FIG. 1. In the following, the film 15 will be further described using FIG. 1 and FIG. 2. The film 15 faces the heat radiating surface 13 and has an outer periphery whose length is longer than that of an outer periphery L1 of the heat radiating surface 13. Hereinafter, the outer periphery of the film 15 is referred to as a first outer periphery. Further, as shown in FIG. 2, the film 15 is placed in such a way that the outer periphery L1 of the heat radiating surface 13 is placed inside the first outer periphery. In the semiconductor module 10 shown in FIG. 1, in the case where the length of the outer periphery L1 of the heat radiating surface 13 is supposed to be shorter than that of an outer periphery L2 of the semiconductor module 10, it is preferable that the outer periphery L2 of the semiconductor module 10 is placed inside the first outer periphery.

The film 15 may be made from any suitable material, for example such as a fluorine resin, a polyethylene terephthalate or a polyimide.

In addition, as shown in FIG. 2, the film 15 has a mark 17 indicating an attachment position. The mark 17 indicates a position where the edge of the pattern 14 is bonded when the film 15 is bonded to the pattern 14. Although, as an example, a right angle symbol is shown in FIG. 2, the shape of the mark is not limited thereto, and it may be a multiplication sign, a circle, an asterisk, or only a line. In addition, it may be a straight line, a dotted line, or a broken line. Further, the mark 17 may indicate an edge of the semiconductor module 10 instead of that of the pattern 14, and it does not necessarily indicate the edge, but may indicate a center.

If the film 15 is transparent, the surface on which the mark 17 is formed may be either the bonding surface 16 of the film 15 or the surface opposite to the bonding surface 16, and it is only necessary to be formed on either of the surfaces. If the film 15 is not transparent, the surface on which the mark is formed may be either the bonding surface 16 of the film 15 or the surface facing the bonding surface 16, but it is preferably formed on both surfaces.

Figure 3:
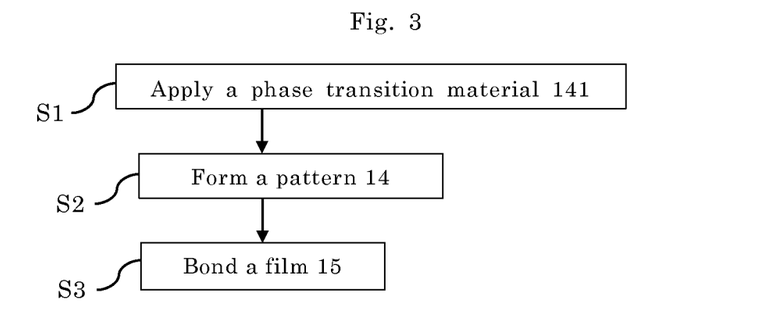
FIG. 3 is a flowchart showing processes of a manufacturing method for the semiconductor device 100 according to Embodiment 1 of the invention.

Next, a manufacturing method for the semiconductor device 100 according to Embodiment 1 of the invention will be described. FIG. 3 is a flowchart showing processes of the manufacturing method for the semiconductor device 100 according to Embodiment 1 of the invention. In Step S1 shown in FIG. 3, the phase transition material 141 is applied on the heat radiating surface 13 of the semiconductor module 10. Then, in Step S2, the first component included in the phase transition material 141 to adjust its viscosity is volatilized to form the pattern 14. Lastly, in Step S3, the film 15 is bonded so as to cover the pattern 14, and thus the semiconductor device 100 is realized.

Figure 4:
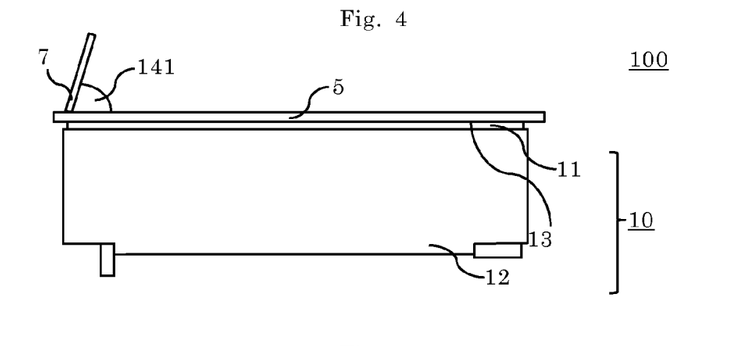
FIG. 4 is a side view of the semiconductor device 100 during manufacturing for explaining a step S1 in the manufacturing process of the semiconductor device 100 according to Embodiment 1 of the invention.
Figure 5:
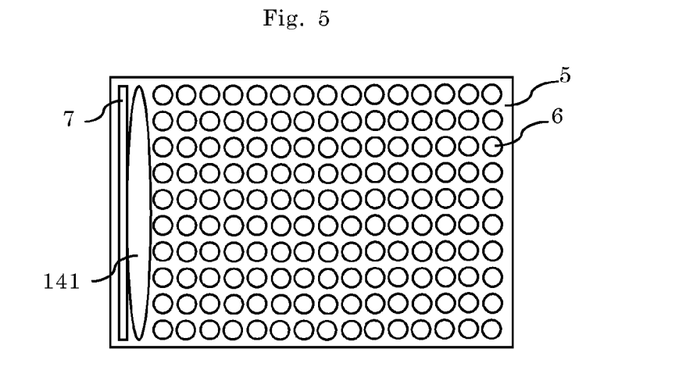
FIG. 5 is a top view of the semiconductor device 100 during manufacturing for explaining the step S1 in the manufacturing process of the semiconductor device 100 according to Embodiment 1 of the invention.
Figure 6:
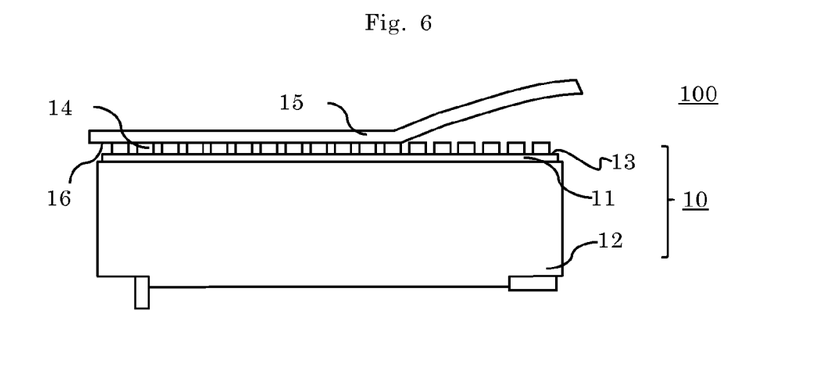
FIG. 6 is a side view of the semiconductor device 100 during manufacturing for explaining a step S3 in the manufacturing process of the semiconductor device 100 according to Embodiment 1 of the invention.

Next, referring to FIG. 4 through FIG. 6, Step S1 through Step S3 in FIG. 3 will be described in detail. Note that, FIG. 4 is a side view of the semiconductor device 100 during manufacturing for explaining the step S1 in the manufacturing process of the semiconductor device 100 according to Embodiment 1 of the invention, where a patterning mask 5 is attached on the heat radiating surface 13 of the semiconductor module 10 and the phase transition material 141 is being applied using a squeegee 7. FIG. 5 is a diagram viewed from the upper side in FIG. 4 and a top view of the semiconductor device 100 under the manufacturing process of the semiconductor device 100 for explaining the step S1 in the manufacturing process according to Embodiment 1 of the invention. FIG. 6 is a side view of the semiconductor device 100 under the manufacturing process of the semiconductor device 100 for explaining the step S3 in the manufacturing process according to Embodiment 1 of the invention. It is noted that the components in FIG. 4 through FIG. 1 indicated by the same reference numerals as those used in FIG. 1 through FIG. 3 are the same or corresponding components and descriptions thereof will be omitted.

In Step S1, as shown in FIG. 4 and FIG. 5, the phase transition material 141 is applied on the heat radiating surface 13 of the metal plate 11 in the semiconductor module 10 using the patterning mask 5 and the squeegee 7. Note that, the patterning mask 5 used for applying the phase transition material 141 may be a metal mask or a mesh mask, etc. The shape of an opening 6 is not necessarily a circular shape shown in FIG. 5. It is only necessary to be designed so as for the semiconductor module 10 to make close contact with the heat radiator, and may be a shape designed to optimize heat dissipation from the semiconductor module 10 to the heat radiator. Further, instead of the squeegee 7, a roller may be used for applying the phase transition material 141.

In Step S2, the first component that is volatile, included in the phase transition material 141 to adjust the viscosity thereof and applied on the heat radiating surface 13 is volatilized to form the pattern 14. The first component included in the phase transition material 141 may be volatilized by leaving it at a room temperature for a long time or by raising its temperature using a drying machine.

In Step S3, as shown in FIG. 6, the film 15 is bonded so as to cover the pattern 14 formed on the heat radiating surface 13. At this moment, the bonding surface 16 of the first film makes contact with the pattern 14. In addition, the bonding of the film 15 to the pattern 14 is carried out using the mark 17 as a guide for positioning.

By the above-described manufacturing method of the semiconductor device 100 shown in FIG. 3, the semiconductor device 100 shown in FIG. 1 is realized.

In the semiconductor device 100 according to Embodiment 1 of the invention, when the semiconductor module 10 is attached to the heat radiator, a customer who purchased the semiconductor device 100 peels off the film 15 from the pattern 14 in the semiconductor device 100 and then attaches the pattern 14 to the heat radiator so as for the pattern 14 to make contact with the heat radiator. When the semiconductor module 10 is operated after being attached to the heat radiator through the pattern 14, the pattern 14 is liquefied owing to the heat generated in the semiconductor elements mounted inside the semiconductor module 10, and then wetly spreads in the interface between the semiconductor module 10 and the heat radiator.

In the semiconductor device 100, with the above described configuration according to Embodiment 1 of the invention, the effect is such that, even if a shock is applied to the pattern 14 formed with the phase transition material 141 that has been liquefied owing to a high temperature of the semiconductor device 100 when the environmental temperature is not sufficiently controlled at the time of shipment to a customer or during transportation to a customer, etc., collapse of the shape of the pattern 14 can be reduced owing to a tension in the interface between the pattern 14 and the film 15.

Since the pattern 14 is covered with the film 15, the effect is such that the pattern 14 is protected from attachment of foreign matter at the time of shipment to a customer or during transportation to a customer, etc.

The semiconductor device 100 only requires peeling of the film 15 and does not require the formation process of the pattern 14 at a workplace for the attachment of the semiconductor module 10 to the heat radiator, and thus it is effective in reducing working hours and enhancing work efficiency.

Furthermore, if the pattern 14 is configured with a plurality of coated regions in the semiconductor device 100, the effect is such that, at a workplace for the attachment of the semiconductor module 10 to the heat radiator, the stress induced on the pattern 14 when peeling off the first film 15 can be reduced and the film 15 is easily peeled off.

The pattern 14 can be formed by volatilizing the first component being liquid at a room temperature in the phase transition material 141 that is applied on the heat radiating surface 13. Since the pattern 14 is dried in the semiconductor device 100, the effect is such that, when peeling off the film 15 at a workplace for the attachment of the semiconductor module 10 to the heat radiator, the pattern 14 remains on the heat radiating surface 13 without collapse of the shape of the pattern and does not cling to the peeled film 15, and the film 15 is easily peeled off.

In addition, since the film 15 has an outer periphery whose length is longer than that of the outer periphery of the heat radiating surface 13 in the semiconductor device 100, the effect is such that, at a workplace for the attachment of the semiconductor module 10 to the heat radiator, the film 15 is easily peeled off since the film 15 has a holding margin for the peeling of the film 15. The film 15 can also be peeled off not only from one direction but also from a plurality of directions, and thus the semiconductor device 100 brings about an effect of reducing collapse of the shape of the pattern 14 due to the peeling of the film 15 by peeling off the film 15 little by little from a plurality of directions in turn. Also in the manufacturing process for the semiconductor device 100, the bonding of the film 15 to the pattern 14 can be made easy, so that the work efficiency is enhanced.

Furthermore, the bonding surface 16 of the film 15 is made rough, so that the bonding property between the film 15 and the pattern 14 is enhanced by an anchor effect between the film 15 and the pattern 14. Therefore, even if a shock is applied to the pattern 14 formed with the phase transition material 141 that is liquefied owing to a high temperature of the semiconductor device 100 when the environmental temperature is not sufficiently controlled at the time of shipment to a customer or during transportation to a customer, etc., collapse of the shape of the pattern 14 in the semiconductor device 100 can be reduced. Further, at a workplace for the attachment of the semiconductor module 10 to the heat radiator, the semiconductor device 100 is effective in that slipping of fingers is hard to occur when the film 15 is peeled off, and thus the film 15 can be easily peeled off.

In addition, since the mark 17 is formed in the film 15, the effect is such that the positioning can be facilitated when the pattern 14 is covered with the film 15 in the manufacturing process for the semiconductor device 100 and the work efficiency can be enhanced.

Figure 7:
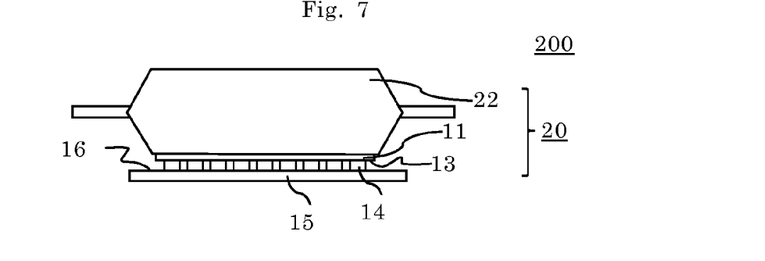
FIG. 7 is a side view of a semiconductor device 200 as a variation according to Embodiment 1 of the invention.

According to Embodiment 1 of the invention, the semiconductor device 100 includes the semiconductor module 10, the pattern 14, and the film 15 having the bonding surface 16, and the semiconductor module 10 includes the metal plate 11 having the heat radiating surface 13 and the case 12. However, the semiconductor module 10 is not limited to the configuration, and as a variation of Embodiment 1 of the invention shown in FIG. 7, a semiconductor module 20 may include the metal plate 11 formed with the heat radiating surface 13 and a sealing resin 22 such as a thermosetting epoxy resin that seals the semiconductor elements. Therefore, the semiconductor device 100 according to Embodiment 1 of the invention may be the semiconductor device 200 that includes the semiconductor module 20, the pattern 14, and the film 15 having the bonding surface 16.

The heat radiating surface 13 of the semiconductor module 10 and the semiconductor module 20 does not have to include the metal plate 11, but may include another component, for example, the case 12 that is made from a heat conductive material.

Embodiment 2

Figure 8:
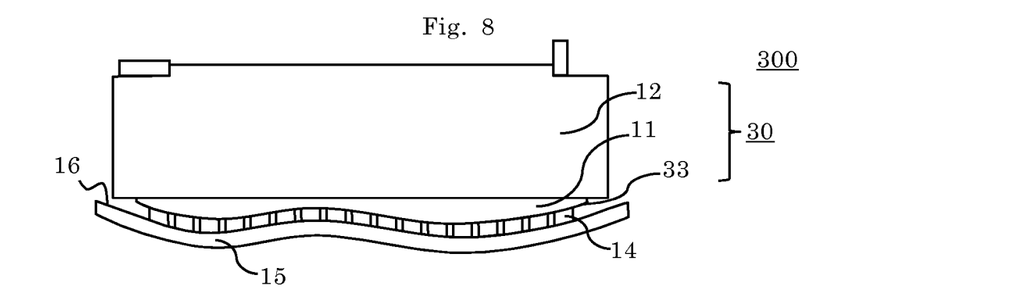
FIG. 8 is a side view of a semiconductor device 300 according to Embodiment 2 of the invention.

FIG. 8 is a side view of a semiconductor device 300 according to Embodiment 2 of the invention. It is noted that the components in FIG. 8 indicated by the same reference numerals as those used in FIG. 1 through FIG. 7 are the same or corresponding components and descriptions thereof will be omitted. The semiconductor device 300 according to Embodiment 2 of the invention differs from that in Embodiment 1 of the invention in the shape of the heat radiating surface. Other than the difference, it is the same as those in Embodiment 1 of the invention. In Embodiment 2 of the invention, portions different from those in Embodiment 1 of the invention will be described and descriptions of the same and corresponding portions will be omitted.

As shown in FIG. 8, the semiconductor device 300 according to Embodiment 2 of the invention includes a semiconductor module 30, the pattern 14, and the film 15 serving as the first film having the bonding surface 16. In addition, the mark 17, not shown in the figure, is formed in the film 15. The semiconductor module 30 includes the metal plate 11 and the case 12, and the metal plate 11 has a heat radiating surface 33 dissipating heat generated in mounted semiconductor elements to a heat radiator. Here, as shown in FIG. 8, the heat radiating surface 33 is an undulating surface. As is the case with the semiconductor module 10 of the semiconductor device 100 according to Embodiment 1 of the invention, semiconductor elements are mounted inside the semiconductor module 30, and the heat generated in the mounted semiconductor elements is dissipated by attaching the semiconductor module 30 to the heat radiator.

Figure 9:
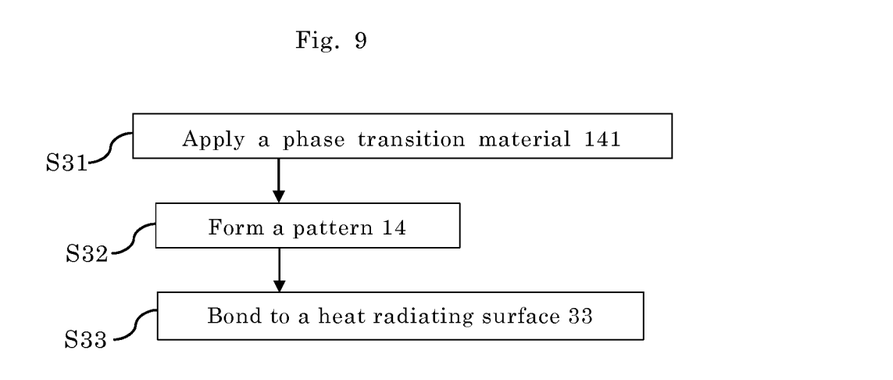
FIG. 9 is a flowchart showing processes of a manufacturing method for the semiconductor device 300 according to Embodiment 2 of the invention.

Next, a manufacturing method for the semiconductor device 300 according to Embodiment 2 of the invention will be described. FIG. 9 is a flowchart showing processes of the manufacturing method for the semiconductor device 300 according to Embodiment 2 of the invention. In Step S31 shown in FIG. 9, the phase transition material 141 is applied on the film 15. Then in Step S32, the first component that is volatile and included in the phase transition material 141 to adjust the viscosity thereof is volatilized to form the pattern 14. Lastly in Step S33, the pattern 14 is bonded to the heat radiating surface 33 of the semiconductor module 30, completing the semiconductor device 300.

Figure 10:
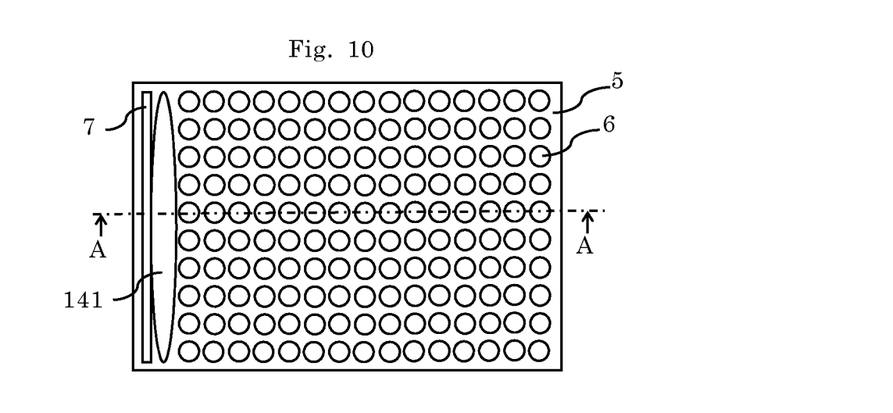
FIG. 10 is a top view of the semiconductor device 300 during manufacturing for explaining a step S31 in the manufacturing process of the semiconductor device 300 according to Embodiment 2 of the invention.
Figure 11:
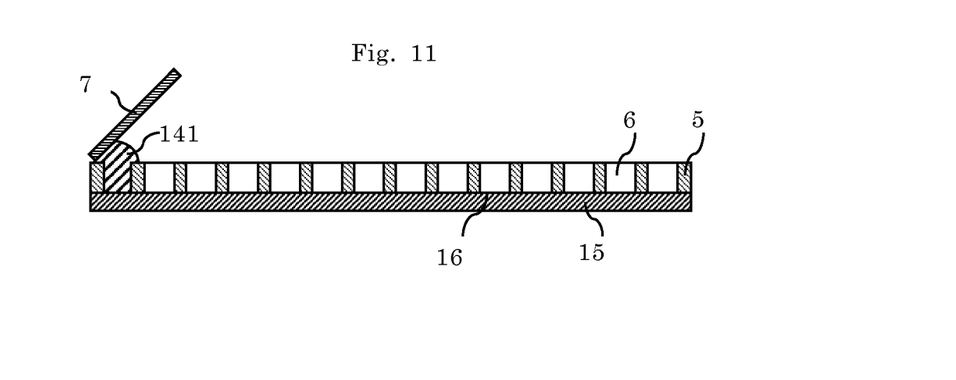
FIG. 11 is a cross-sectional view of the semiconductor device 300 during manufacturing for explaining the process S31 in the manufacturing process of the semiconductor device 300 according to Embodiment 2 of the invention.
Figure 12:
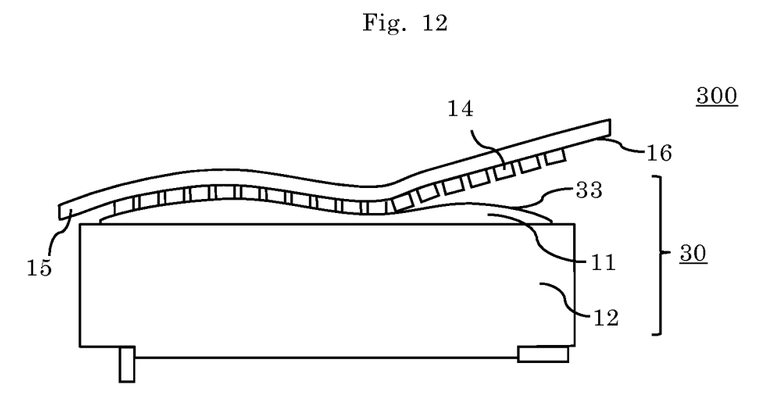
FIG. 12 is a side view of the semiconductor device 300 during manufacturing for explaining a process S33 in the manufacturing process of the semiconductor device 300 according to Embodiment 2 of the invention.

Referring to FIG. 10 through FIG. 12, Step S31 through Step S33 in FIG. 9 will be described in detail. FIG. 10 is a top view of the semiconductor device 300 under the manufacturing process for explaining the process S31 in the manufacturing process of the semiconductor device 300 according to Embodiment 2 of the invention. FIG. 11 is a cross-sectional view of the semiconductor device 300 under the manufacturing process for explaining the process S31 in the manufacturing process of the semiconductor device 300 according to Embodiment 2 of the invention, which corresponds to a cross sectional view in the A-A cross section in FIG. 10. FIG. 12 is a side view of the semiconductor device 300 under the manufacturing process for explaining the process S33 in the manufacturing process of the semiconductor device 300 according to Embodiment 2 of the invention. It is noted that the components in FIG. 10 trough FIG. 12 indicated by the same reference numerals as those used in FIG. 1 through FIG. 9 are the same or corresponding components and descriptions thereof will be omitted.

In Step S31, as shown in FIG. 10 and FIG. 11, using the patterning mask 5 and the squeegee 7, the phase transition material 141 is applied on one of the faces of the flat film 15, that is, on the bonding surface 16 in this case. Note that, the patterning mask 5 used for applying the phase transition material 141 may be a metal mask or a mesh mask, etc. The shape of the opening 6 is not necessarily a circular shape shown in FIG. 10. It may be designed so as for the semiconductor module 30 to make close contact with the heat radiator, and is only necessary to be a shape designed to optimize heat dissipation from the semiconductor module 30 to the heat radiator. Further, instead of the squeegee 7, a roller may be used for applying the phase transition material 141.

In Step S32, the first component that is volatile, included in the phase transition material 141 to adjust the viscosity thereof and applied on the bonding surface 16 is volatilized to form the pattern 14. The first component included in the phase transition material 141 may be volatilized by keeping it at a room temperature for a long time or by raising its temperature using a drying machine.

In Step S33, as shown in FIG. 12, the pattern 14 formed on the bonding surface 16 is bonded to the heat radiating surface 33 of the semiconductor module 30, using the mark 17 as a guide for positioning at this time.

By the manufacturing method of the semiconductor device 300 that is described above and shown in FIG. 9, the semiconductor device 300 shown in FIG. 8 is completed.

As is the case with the semiconductor device 100 according to Embodiment 1 of the invention, in the semiconductor device 300 according to Embodiment 2 of the invention, when the semiconductor module 30 is attached to the heat radiator, a customer who purchased the semiconductor device 300 peels off the film 15 from the pattern 14 in the semiconductor device 300 and then attaches the pattern 14 to the heat radiator so as for the pattern 14 to make contact with the heat radiator. When the semiconductor module 10 is operated after being attached to the heat radiator through the pattern 14, the pattern 14 is liquefied owing to the heat generated in the semiconductor elements mounted inside the semiconductor module 10, and then wetly spreads in the interface between the semiconductor module 10 and the heat radiator.

Since the semiconductor device 300 according to Embodiment 2 of the invention is configured in the manner described above, the same effect as that in Embodiment 1 of the invention can be obtained. Besides, in the manufacturing method for the semiconductor device 300 according to Embodiment 2 of the invention, the pattern 14 is formed on the flat film 15 and is bonded to the heat radiating surface 33 being the undulating surface, and thus the effect is such that the pattern 14 formed by transferring the shape of the opening 6 in the patterning mask 5 can be formed even on the undulating surface of the heat radiating surface 33.

The manufacturing method for the semiconductor device 300 according to Embodiment 2 of the invention may be applied to the manufacturing method for the semiconductor device 100 according to Embodiment 1 of the invention by replacing the semiconductor module 30 and the heat radiating surface 33 with the semiconductor module 10 and the heat radiating surface 13, respectively. In this case, the same effect as that in Embodiment 2 of the invention can be obtained.

Further, as the manufacturing method for the semiconductor device 300 according to Embodiment 2 of the invention, the manufacturing method for the semiconductor device 100 according to Embodiment 1 of the invention may be applied by replacing the semiconductor module 10 and the heat radiating surface 13 with the semiconductor module 30 and the heat radiating surface 33, respectively. In this case, the same effect as that in Embodiment 1 of the invention can be obtained in the semiconductor device 300 according to Embodiment 2 of the invention.

According to Embodiment 2 of the invention, the semiconductor device 300 includes the semiconductor module 30, the pattern 14, and the film 15 having the bonding surface 16, and the semiconductor module 30 includes the metal plate 11 having the heat radiating surface 33 and the case 12 in the semiconductor device 300. However, the semiconductor module 30 is not limited to the configuration, and as a variation of Embodiment 2 of the invention, a semiconductor module may include the metal plate 11 formed with the heat radiating surface 33 and a sealing resin such as a thermosetting epoxy resin that seals the semiconductor elements. Further, the metal plate 11 does not necessarily have the heat radiating surface 33, but a surface of another component such as the case 12 that is made of a heat conductive material may be used.

Embodiment 3

Figure 13:
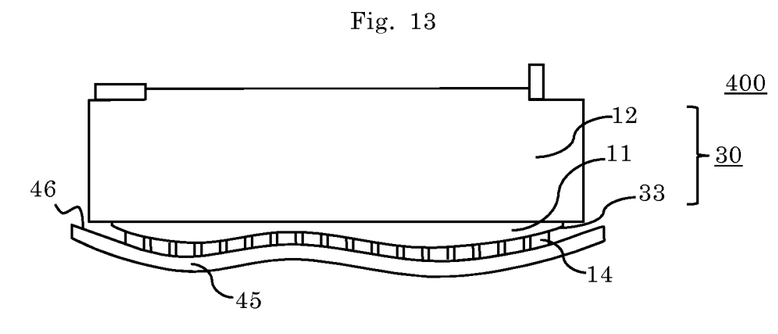
FIG. 13 is a side view showing a semiconductor device 400 according to Embodiment 3 of the invention.

FIG. 13 is a side view showing a semiconductor device 400 according to Embodiment 3 of the invention. The components in FIG. 13 indicated by the same reference numerals as those used in FIG. 1 through FIG. 12 are the same or the corresponding components and descriptions thereof will be omitted. The semiconductor device 400 according to Embodiment 3 of the invention differs from those in Embodiment 1 and Embodiment 2 of the invention in the film that covers the pattern 14. Other than the difference, it is the same as those in Embodiment 1 and Embodiment 2 of the invention. In Embodiment 3 of the invention, components different from those in Embodiment 1 and Embodiment 2 of the invention will be described and descriptions of the same and corresponding portions will be omitted.

First, in FIG. 13, the semiconductor device 400 according to Embodiment 3 of the invention includes the semiconductor module 30, the pattern 14, and a film 45 serving as the first film having a bonding surface 46. In the semiconductor device 400 according to Embodiment 3 of the invention, only the film 15 in the semiconductor device 300 according to Embodiment 2 of the invention is replaced with the film 45.

The film 45 of the semiconductor device 400 according to Embodiment 3 of the invention will be described. The film 45 melts or sublimes in a case where heat is generated in the semiconductor elements mounted within the semiconductor module 30. If the film melts, it dissolves in the pattern 14 after the melting, and if the film sublimes, it merges with the surrounding air, not affecting peripheral components by corrosion, etc., after the sublimation.

The film 45 has the bonding surface 46 that is made to be rough as is the case with the bonding surface 16 of the film 15, and has the mark 17 and an outer periphery whose length is longer than that of the outer periphery of heat radiating surface 33 as is the case with the film 15.

In the semiconductor device 400 according to Embodiment 3 of the invention, when the semiconductor module 30 is attached to the heat radiator, a customer who purchased the semiconductor device 400, without peeling off the film 45 from the pattern 14 in the semiconductor device 400, attaches the film 45 to the heat radiator so as for the film 45 to make contact with the heat radiator. When the semiconductor module 30 is operated after being attached to the heat radiator through the pattern 14 and the film 45, the pattern 14 is liquefied owing to the heat generated in the semiconductor elements mounted inside the semiconductor module 30, and then wetly spreads in the interface between the semiconductor module 30 and the heat radiator, and the film 45 melts or sublimes in a case where the heat is generated in the semiconductor elements mounted inside the semiconductor module 30.

Since the semiconductor device 400 according to Embodiment 3 of the invention is configured in the manner described above, the same effect as that in Embodiment 2 of the invention can be obtained. Further, at a workplace for the attachment of the semiconductor module 30 to the heat radiator, the semiconductor module 30 can be attached to the heat radiator without peeling off the film 45. This is effective in that working hours can be reduced and work efficiency can be enhanced.

Although the heat radiating surface 33 has the undulation as shown in FIG. 13 in the semiconductor device 400 according to Embodiment 3 of the invention described above, semiconductor devices in which the films 15 in the semiconductor devices 100 and 200 according to Embodiment 1 of the invention are replaced with the film 45 are also included in Embodiment 3 of the invention. In this case, in addition to the same effect as that in Embodiment 1 of the invention, at a workplace for the attachment of the semiconductor modules 10 and 20 to the heat radiators, the semiconductor modules 10 and 20 can be attached to the heat radiators without peeling off the films 45, and thus the effect is such that working hours can be reduced and work efficiency can be enhanced.

Embodiment 4

Figure 14:
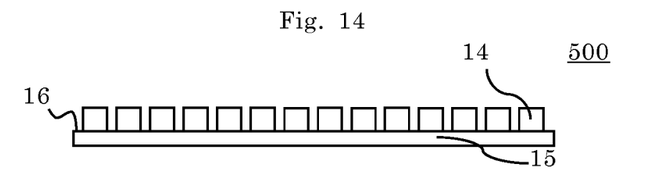
FIG. 14 is a side view showing a transfer sheet 500 according to Embodiment 4 of the invention.

FIG. 14 is a side view showing a transfer sheet 500 according to Embodiment 4 of the invention. It is noted that the components in FIG. 14 indicated by the same reference numerals as those used in FIG. 1 through FIG. 13 are the same or corresponding components and descriptions thereof will be omitted. In the following, the transfer sheet 500 according to Embodiment 4 of the invention will be described under an assumption that the sheet is packed together with the semiconductor devices of Embodiments 1 to 3 of the invention.

First, in FIG. 14, the transfer sheet 500 according to Embodiment 4 of the invention includes the pattern 14 and the film 15 serving as the first film. The film 15 has the bonding surface 16 and the mark 17.

Figure 15:
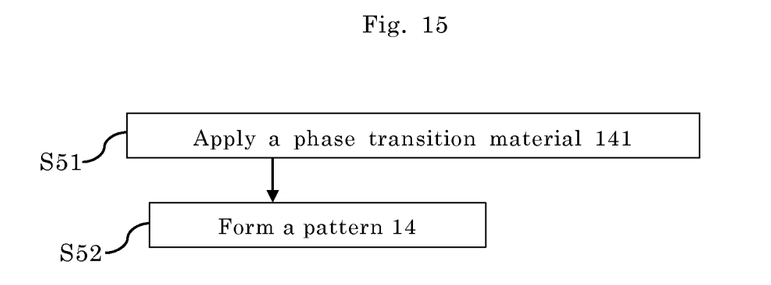
FIG. 15 is a flowchart showing processes of a manufacturing method for the transfer sheet 500 according to Embodiment 4 of the invention.

Next, a manufacturing method for the transfer sheet 500 according to Embodiment 4 of the invention will be described. FIG. 15 is a flowchart showing processes of the manufacturing method for the transfer sheet 500 according to Embodiment 4 of the invention. In Step S51 shown in FIG. 15, the phase transition material 141 is applied on the flat film 15. Then, in Step S52, the first component that is volatile and included in the phase transition material 141 to adjust the viscosity thereof is volatilized to form the pattern 14, so that the transfer sheet 500 is completed. Step S51 in FIG. 15 is the same as Step S31 in FIG. 9, and Step S52 in FIG. 15 is the same as Step S32 in FIG. 9.

The transfer sheet 500 according to Embodiment 4 of the invention is used when a customer who purchased the transfer sheet 500 attaches the semiconductor module to the heat radiator. The semiconductor module is a device in which semiconductor elements are mounted inside and heat generated in the mounted semiconductor elements is dissipated by attaching the semiconductor module to the heat radiator.

When the semiconductor module is attached to the heat radiator, the transfer sheet 500 is bonded to the heat radiating surface so as for the pattern 14 to make contact with the heat radiating surface dissipating heat generated in the semiconductor elements mounted inside the semiconductor module, to the heat radiator. Then, after peeling off the film 15 from the pattern 14, the semiconductor module is attached to the heat radiator so as for the pattern 14 to make contact with the heat radiator. When the semiconductor module is operated after the attachment, the pattern 14 is liquefied owing to the heat generated in the semiconductor elements mounted inside the semiconductor module, and then wetly spreads in the interface between the semiconductor module and the heat radiator.

Instead, the transfer sheet 500 may be bonded so as for the pattern 14 to make contact with a connection surface of the heat radiator that faces the heat radiating surface of the semiconductor module. Then, after peeling off the film 15 from the pattern 14, the semiconductor module is attached so as for the pattern 14 to make contact with the heat radiating surface of the semiconductor module.

In Embodiment 4 of the invention, with such a configuration described above, the customer who purchased the transfer sheet 500 can arbitrarily select either the heat radiating surface of the semiconductor module or the connection surface of the heat radiator that faces the heat radiating surface, as the attachment surface of the transfer sheet 500. Therefore, a simple method can be selected in terms of the attachment of the semiconductor module to the heat radiator, and thus the effect is such that work efficiency can be enhanced at a workplace for the attachment of the semiconductor module on the heat radiator.

Furthermore, even if the heat radiating surface of the semiconductor module or the connection surface of the heat radiator facing the heat radiating surface, to which the transfer sheet 500 is to be attached, has an undulation, the pattern 14 is formed on the flat film 15 and bonded to the heat radiating surface of the semiconductor module or the connection surface of the heat radiator facing the heat radiating surface, and thus the effect is such that the pattern 14 having the shape of the opening 6 of the patterning mask 5 can be formed between the semiconductor module and the heat radiator.

If the transfer sheet 500 is packed together with the semiconductor device 100 according to Embodiment 1 of the invention, the advantage is that the semiconductor module 10 of the semiconductor device 100 according to Embodiment 1 of the invention once attached to the heat radiator is removed from the heat radiator and the transfer sheet can be used for replacement when attached anew to the heat radiator. The transfer sheet 500 is used in such a manner that it is bonded to the heat radiating surface of the removed semiconductor module so as to make contact with the pattern 14. If necessary, the heat radiating surface of the removed semiconductor module is cleaned before the transfer sheet 500 is bonded thereto. Note that the same advantage can be taken if the transfer sheet 500 is packed together with any one of the semiconductor device 200 according to Embodiment 1 of the invention, semiconductor device 300 according to Embodiment 2 of the invention, and the semiconductor device 400 according to Embodiment 3 of the invention.

Furthermore, the transfer sheet 500 according to Embodiment 4 of the invention may be packed together with the semiconductor module 10 of the semiconductor device 100 and the semiconductor module 20 of the semiconductor device 200 according to Embodiment 1 of the invention, and the semiconductor module 30 of the semiconductor device 300 according to Embodiment 2 of the invention and of the semiconductor device 400 according to Embodiment 3 of the invention. In this case, the same effect as that in Embodiment 4 of the invention can be obtained.

Embodiment 5

Figure 16:
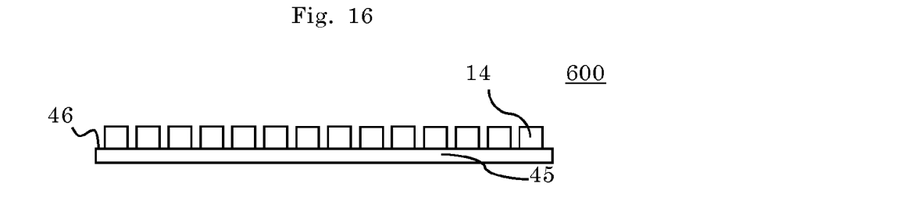
FIG. 16 is a side view showing a transfer sheet 600 according to Embodiment 5 of the invention.

FIG. 16 is a side view showing a transfer sheet 600 according to Embodiment 5 of the invention. The components in FIG. 16 indicated by the same reference numerals as those used in FIG. 1 through FIG. 15 are the same or the corresponding components and descriptions thereof will be omitted. The transfer sheet 600 according to Embodiment 5 of the invention has a difference in film from Embodiment 4 of the invention. Other than that, it is the same as those in Embodiment 4 of the invention. In Embodiment 5 of the invention, portions different from those in Embodiment 4 of the invention will be described and descriptions of the same and corresponding portions will be omitted.

First, in FIG. 16, the transfer sheet 600 according to Embodiment 5 of the invention includes the pattern 14 and the film 45 serving as the first film. The film 45 has the bonding surface 46 and the mark 17. In the transfer sheet 600 according to Embodiment 5 of the invention, only the film 15 in the transfer sheet 500 according to Embodiment 4 of the invention is replaced with the film 45.

As is the case with the transfer sheet 500 according to Embodiment 4 of the invention, the transfer sheet 600 according to Embodiment 5 of the invention is also used when a customer who purchased the transfer sheet 600 attaches the semiconductor module to the heat radiator.

When the semiconductor module is attached to the heat radiator, the transfer sheet 600 is bonded between the heat radiating surface dissipating heat generated in the semiconductor elements mounted inside the semiconductor module, to a heat radiator, and the connection surface of the heat radiator facing the heat radiating surface. In this case, the pattern 14 may contact with either the heat radiating surface of the semiconductor module or the connection surface of the heat radiator. When the semiconductor module is operated, the pattern 14 is liquefied owing to the heat generated in the semiconductor elements mounted inside the semiconductor module, and then wetly spreads in the interface between the semiconductor module and the heat radiator, and the film 45 melts or sublimes in a case where the heat is generated in the semiconductor elements mounted inside the semiconductor module.

Since the transfer sheet 600 according to Embodiment 5 of the invention is configured in the manner described above, the same effect as that in Embodiment 4 of the invention can be obtained. Further, at a workplace for the attachment of the semiconductor module on the heat radiator, the semiconductor module can be attached to the heat radiator without peeling off the film 45. This is effective in that working hours can be reduced and work efficiency can be enhanced.

Embodiment 6

Figure 17:
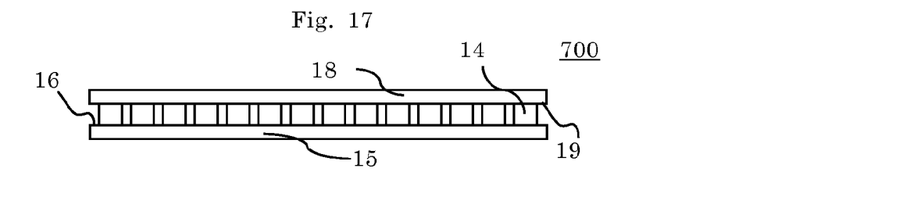
FIG. 17 is a side view showing a transfer sheet 700 according to Embodiment 6 of the invention.

FIG. 17 is a side view showing a transfer sheet 700 according to Embodiment 6 of the invention. Note that the components in FIG. 17 indicated by the same reference numerals as those used in FIG. 1 through FIG. 16 are the same or corresponding components and descriptions thereof will be omitted. In the transfer sheet 700 according to Embodiment 6 of the invention, a configuration is added to the configurations in Embodiment 4 and Embodiment 5 of the invention. In Embodiment 6 of the invention, portions different from those in Embodiment 4 and Embodiment 5 of the invention will be described and descriptions of the same and corresponding portions will be omitted.

First, in FIG. 17, the transfer sheet 700 according to Embodiment 6 of the invention includes the pattern 14, the film 15 serving as the first film, and a film 18 serving as a second film. The film 15 has the bonding surface 16 and the mark 17.

The film 18 has a bonding surface 19, and the mark 17 in the same way as the film 15. The film 18 is made from any suitable material similar to the film 15. In addition, the bonding surface 19 is made to be rough as is the case with the bonding surface 16.

Figure 18:
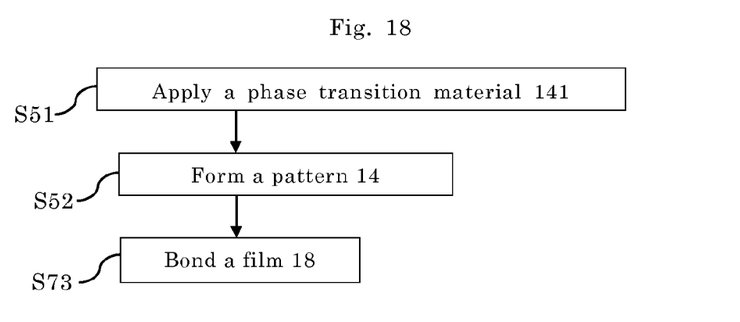
FIG. 18 is a flowchart showing processes of a manufacturing method for the transfer sheet 700 according to Embodiment 6 of the invention.
Figure 19:
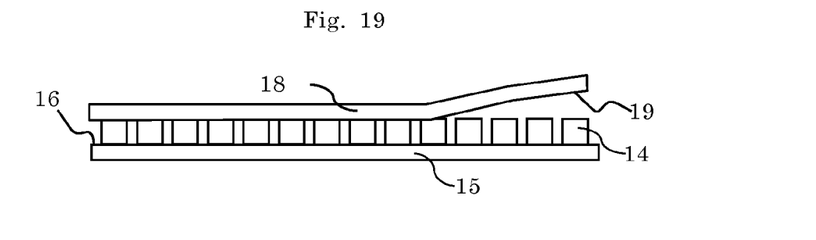
FIG. 19 is a side view of the transfer sheet 700 during manufacturing for explaining a process S73 in the manufacturing process of the transfer sheet 700 according to Embodiment 6 of the invention.

Next, a manufacturing method for the transfer sheet 700 according to Embodiment 6 of the invention will be described. FIG. 18 is a flowchart showing processes of the manufacturing method for the transfer sheet 700 according to Embodiment 6 of the invention. In addition to the steps in the manufacturing processes for the transfer sheet 600 according to Embodiment 4 of the invention, a step is added as Step S73 in which the film 18 as the second film is bonded so as to cover the pattern 14. The transfer sheet 700 is realized through these processes. FIG. 19 is a side view of the transfer sheet 700 during manufacturing for explaining the process step S73 in the manufacturing process of the transfer sheet 700 according to Embodiment 6 of the invention.

The transfer sheet 700 according to Embodiment 6 of the invention is used when a customer who purchased the transfer sheet 700 attaches the semiconductor module to the heat radiator.

Firstly, when the semiconductor module is attached to the heat radiator, either the film 15 or the film 18 in the transfer sheet 700 is peeled off. Then, the transfer sheet is bonded to the heat radiating surface so as for the pattern 14 to make contact with the heat radiating surface dissipating heat generated in the semiconductor elements mounted inside the semiconductor module, to a heat radiator. Subsequently, the semiconductor module is attached to the heat radiator so as for the pattern 14 to make contact with the heat radiator after the other remaining film is peeled off from the pattern 14. After the attachment, when the semiconductor module is operated, the pattern 14 is liquefied owing to the heat generated in the semiconductor elements mounted inside the semiconductor module, and then wetly spreads in the interface between the semiconductor module and the heat radiator.

Instead, after either the film 15 or the film 18 is peeled off, the transfer sheet 700 may be bonded so as for the pattern 14 to make contact with the connection surface of the heat radiator facing the heat radiating surface of the semiconductor module. Then, the remaining film is peeled off from the pattern 14 and the semiconductor module is attached to the heat radiator so as for the pattern 14 to make contact with the heat radiating surface of the semiconductor module.

Since the transfer sheet 700 according to Embodiment 6 of the invention is configured in the manner described above, the same effect as that in Embodiment 4 of the invention can be obtained. Further the effect is such that the pattern 14 of the transfer sheet 700 is protected from attachment of foreign matter at the time of shipment to a customer or during transportation to a customer, etc.

Still further, the transfer sheet 700 is effective in that, even if a shock is applied to the pattern 14 formed with the phase transition material 141 that is liquefied owing to a high temperature of the transfer sheet 700 when the environmental temperature is not sufficiently controlled at the time of shipment to a customer or during transportation to a customer, etc., collapse of the shape of the pattern 14 can be reduced owing to a tension in the interface between the pattern 14 and the film 15, and the pattern 14 and the film 18, Although, as shown in FIG. 17, the transfer sheet 700 according to Embodiment 6 of the invention described above is realized by adding the film 18 to the transfer sheet 500 according to Embodiment 4 of the invention, Embodiment 6 of the invention also applies to a transfer sheet in which the film 18 is added to the transfer sheet 600 according to Embodiment 5 of the invention, and thus the same effect can be obtained. Further, in this case, at a workplace for the attachment of the semiconductor module to the heat radiator, the effect is such that working hours can be reduced and work efficiency can be enhanced, since only the film 18 needs to be peeled off and the semiconductor module can be attached to the heat radiator without peeling off the film 45.

Embodiment 7

Figure 20:
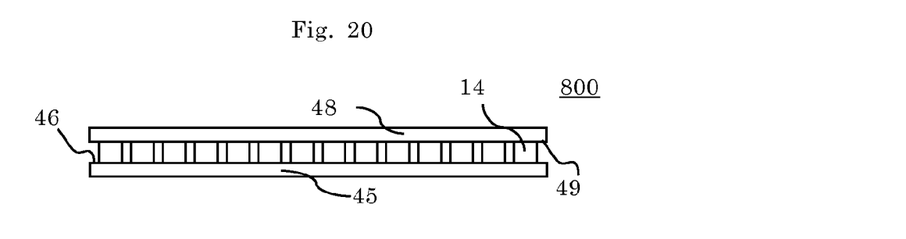
FIG. 20 is a side view showing a transfer sheet 800 according to Embodiment 7 of the invention.

FIG. 20 is a side view showing a transfer sheet 800 according to Embodiment 7 of the invention. Note that the components in FIG. 20 indicated by the same reference numerals as those used in FIG. 1 through FIG. 19 are the same or corresponding components and descriptions thereof will be omitted. The transfer sheet 800 according to Embodiment 7 of the invention has a difference in film from Embodiment 6 of the invention. Other than that, it is the same as those in Embodiment 6 of the invention. In Embodiment 7 of the invention, components different from those in Embodiment 6 of the invention will be described and descriptions of the same and corresponding components will be omitted.

First, in FIG. 20, the transfer sheet 800 according to Embodiment 7 of the invention includes the pattern 14, the film 45 serving as the first film, and a film 48 serving as the second film. The film 45 has the bonding surface 46 and the mark 17. The film 48 has a bonding surface 49 and the mark 17.

As is the case with the film 45, the film 48 melts or sublimes by heat. If the film melts, it dissolves in the pattern 14 after the melting, and if the film sublimes, it merges with the surrounding air, not affecting peripheral components by corrosion, etc., after the sublimation. In addition, the bonding surface 49 is made to be rough as is the case with the bonding surface of the film 46. In the transfer sheet 800 according to Embodiment 7 of the invention, only the film 15 and the film 18 in the transfer sheet 700 according to Embodiment 6 of the invention is replaced with the film 45 and the film 48, respectively.

As is the case with the transfer sheet 700 according to Embodiment 6 of the invention, the transfer sheet 800 according to Embodiment 7 of the invention is also used when a customer who purchased the transfer sheet 800 attaches the semiconductor module to the heat radiator.

When the semiconductor module is attached to the heat radiator, the transfer sheet 800 is bonded between the heat radiating surface dissipating heat generated in the semiconductor elements mounted inside the semiconductor module, to a heat radiator, and the connection surface of the heat radiator facing the heat radiating surface. In this case, either the film 45 or the film 48 may contact with the heat radiating surface of the semiconductor module. When the semiconductor module is operated, the pattern 14 is liquefied owing to the heat generated in the semiconductor elements mounted inside the semiconductor module, and then wetly spreads in the interface between the semiconductor module and the heat radiator. The films 45 and 48 melt or sublime in a case where the heat is generated in the semiconductor elements mounted inside the semiconductor module.

Since the transfer sheet 800 according to Embodiment 7 of the invention is configured in the manner described above, the same effect as that in Embodiment 6 of the invention can be obtained. Further, at a workplace for the attachment of the semiconductor module on the heat radiator, the semiconductor module can be attached to the heat radiator without peeling off the films 45 and 48. This is effective in that working hours can be reduced and work efficiency can be enhanced.

It is noted that, within the scope of the invention, each embodiment can be freely combined, or each embodiment can properly be modified or be omitted.

EXPLANATION OF REFERENCE NUMERALS

5 patterning mask,
6 opening,
7 squeegee,
10, 20, 30 semiconductor module,
11 metal plate,
12 case,
13, 33 heat radiating surface,
14 pattern,
15, 18, 45, 48 film,
16, 19, 46, 49 bonding surface,
17 mark,
22 sealing resin,
100, 200, 300, 400 semiconductor device,
141 phase transition material,
500, 600, 700, 800 transfer sheet,
L1 outer periphery of heat radiating surface 13,
L2 outer periphery of semiconductor module 10

The invention claimed is:

1. A semiconductor device comprising:
a semiconductor module including a semiconductor element and having a heat radiating surface adapted to dissipate heat generated in the semiconductor element;
a pattern made from a phase transition material and formed on the heat radiating surface; and
a first film being flexible and covering the pattern,
wherein the first film melts or sublimes in a case where the heat generated in the semiconductor element is conducted to the pattern.

2. The semiconductor device according to claim 1, wherein the first film faces the heat radiating surface and has a first outer periphery whose length is longer than that of an outer periphery of the heat radiating surface, and the outer periphery of the heat radiating surface is placed inside the first outer periphery.

3. The semiconductor device according to claim 1, wherein a surface of the first film bonded to the pattern is a rough surface.

4. The semiconductor device according to claim 1, wherein the first film has a mark indicating an attachment position.

5. A heat-conductive sheet configured to be disposed between a semiconductor module and a heat radiator, the heat-conductive sheet comprising:
a flexible film made of a material configured to melt or sublime by heat generated in the semiconductor module; and
a pattern made of a phase transition material, the pattern being formed on one surface of the flexible film and configured to be disposed between the semiconductor module and the heat radiator.

6. The heat-conductive sheet according to claim 5, wherein a surface of the flexible film bonded to the pattern is made rough.

7. The heat-conductive sheet according to claim 5, wherein the flexible film has a mark indicating an attachment position.

8. The heat-conductive sheet according to claim 5, further comprising a second film covering the pattern on the opposite side from the flexible film.

9. The heat-conductive sheet according to claim 8, wherein a surface of the second film bonded to the pattern is made rough.

10. The heat-conductive sheet according to claim 8, wherein the second film has a mark indicating an attachment position.

11. The heat-conductive sheet according to claim 8, wherein the second film is made from a material configured to melt or sublime by the heat generated in the semiconductor module.

* * * * *